United States Patent
Oden et al.

(10) Patent No.: US 10,023,952 B2
(45) Date of Patent: Jul. 17, 2018

(54) COATED CUTTING TOOL AND A METHOD FOR COATING THE CUTTING TOOL

(71) Applicant: SECO TOOLS AB, Fagersta (SE)

(72) Inventors: Magnus Oden, Tullinge (SE); Rikard Forsen, Linghem (SE); Mats Johansson-Joesaar, Orebro (SE); Syed Muhammad Bilal, Linkoping (SE); Naureen Ghafoor, Linghem (SE)

(73) Assignee: SECO TOOLS AB, Fagersta (SE)

( * ) Notice: Subject to any disclaimer, the term of this patent is extended or adjusted under 35 U.S.C. 154(b) by 0 days.

(21) Appl. No.: 14/916,145

(22) PCT Filed: Sep. 5, 2013

(86) PCT No.: PCT/EP2013/068327
§ 371 (c)(1),
(2) Date: Mar. 2, 2016

(87) PCT Pub. No.: WO2015/032431
PCT Pub. Date: Mar. 12, 2015

(65) Prior Publication Data
US 2016/0194748 A1 Jul. 7, 2016

(51) Int. Cl.
*B32B 27/14* (2006.01)
*C23C 14/32* (2006.01)
(Continued)

(52) U.S. Cl.
CPC .......... *C23C 14/325* (2013.01); *B23B 27/148* (2013.01); *B23B 51/00* (2013.01);
(Continued)

(58) Field of Classification Search
USPC .......... 51/307, 309; 428/216, 336, 697, 698, 428/699; 204/192.15
See application file for complete search history.

(56) References Cited

U.S. PATENT DOCUMENTS

2002/0166606 A1* 11/2002 Caminiti ............... B32B 15/012
428/698
2012/0114442 A1 5/2012 Johansson et al.

FOREIGN PATENT DOCUMENTS

EP 603486 * 6/1994
JP 2006082209 A 3/2006
(Continued)

OTHER PUBLICATIONS

Dejun "Synthesis of ZrAlN coatings with thermal stability at high temperture" Sci in China Series E:Techn Sci (2006) vol. 49, No. 5, p. 576-581.*
(Continued)

*Primary Examiner* — A. A. Turner
(74) *Attorney, Agent, or Firm* — Corinne R. Gorski

(57) ABSTRACT

A coated cutting tool and a hard and wear resistant coating for a body include at least one metal based nitride layer. The layer is (ZrxCr1-x-y-zAlyMez)Na with 0.55<x<0.85, 0.05<y<0.45, 0≤z<0.20, 0.95<a<1.10, and Me is one or more of the elements: Y, Ti, V, Nb, Ta, Mo, W, Mn or Si. The layer can have a thickness between 0.5 μm and 15 μm and be comprisied of a single cubic phase or a single hexagonal phase or a mixture thereof. In an exemplary embodiment, the layer is a cubic phase of a sodium chloride structure. The layer can be deposited using cathodic arc evaporation and is useful for metal cutting applications generating high temperatures.

11 Claims, 2 Drawing Sheets

(51) Int. Cl.
*G02B 13/06* (2006.01)
*G03B 37/06* (2006.01)
*B23B 27/14* (2006.01)
*B23B 51/00* (2006.01)
*B23C 5/10* (2006.01)
*G02B 3/00* (2006.01)

(52) U.S. Cl.
CPC ............ *B23C 5/10* (2013.01); *G02B 13/06* (2013.01); *G03B 37/06* (2013.01); *B23B 2222/28* (2013.01); *B23B 2222/32* (2013.01); *B23B 2226/125* (2013.01); *B23B 2226/18* (2013.01); *B23B 2228/10* (2013.01); *B23C 2222/28* (2013.01); *B23C 2222/32* (2013.01); *B23C 2226/125* (2013.01); *B23C 2226/18* (2013.01); *B23C 2228/10* (2013.01); *G02B 2003/0093* (2013.01)

(56) References Cited

FOREIGN PATENT DOCUMENTS

| | | |
|---|---|---|
| JP | 2006289537 A | 10/2006 |
| JP | 2007007765 A | 1/2007 |
| WO | 200605217 | 1/2006 |

OTHER PUBLICATIONS

Hasegawa et al "Effects of Al cconents on microstructures of Cr(1-x)Al(x)N and Zr(10x)Al(x)N films sythesized by cathodic method" Surf. & Coat. Techn. 200 (2005) p. 2409-2413.*

W.Z. Li et al. "Influence of Al on the microstructure and mechanical properties of Cr—Zr—(Al-)N coatings iwth low and high Zr content", Surface and Coatings Technology, vol. 206, No. 18, May 1, 2012.

Lamni R et al. "Microstucture and nanohardness properties of Zr—Al—N and Zr—Cr—N thin films", Journal of Vacuum Science and Technology: Part A, AVS /AIP, Melville, NY, US, vol. 23 No. 4 Jun. 7, 2005, p. 593-598.

* cited by examiner

COATED CUTTING TOOL AND A METHOD FOR COATING THE CUTTING TOOL

RELATED APPLICATION DATA

This application is a § 371 National Stage Application of PCT International Application No. PCT/EP2013/068327 filed Sep. 5, 2013.

TECHNICAL FIELD

The present invention relates to a coated cutting tool comprising a body and a coating designed to be used in metal cutting applications generating high tool temperatures. The coating comprising at least one Zr,Cr,Al-based nitride layer. The invention also relates to a method for coating the cutting tool and to the use of the cutting tool.

BACKGROUND OF THE INVENTION

Since the mid 1980's, efforts have been made to improve the properties, for example, wear resistance and hence the performance of tool coatings. At that time, the common practice was to coat cutting tools with TiN. However, due to its relatively poor oxidation resistance at elevated temperatures, the focus has shifted towards more complex ternary and quaternary compounds, e.g. Ti—Al—N, Ti—Al—Si—N and Ti—Cr—Al—N with improved high temperature performance. For example, Ti—Al—Si—N has been reported as super hard, H >40 GPa, explained in terms of a two phase structure consisting of crystalline phase of NaCl-type in combination with x-ray amorphous $Si_3N_4$ or $SiN_x$.

JP 20060082209 discloses a coated cutting tool with a coating comprising an upper layer and an lower layer each formed of (Cr,Al,Zr)N. The upper layer has an average thickness of 0.5-1.5 µm and the lower has an average thickness of 2-6 µm. The upper layer has a laminated structure of a thin layer A and a thin layer B, each thin layer having a thickness of 5-20 nm. The lower layer has the formula $(Cr_{1-x-y}Al_xZr_y)N$, where $0.55 \le x \le 0.75$ and $0.05 \le y \le 0.15$.
The thin layer A has the formula $(Cr_{1-x-y}Al_xZr_y)N$, where $0.25 \le x \le 0.40$ and $0.20 \le y \le 0.30$.
The thin layer B has the formula $(Cr_{1-x-y}Al_xZr_y)N$, where $0.55 \le x \le 0.75$ and $0.05 \le y \le 0.15$.

JP 2006289537 discloses a coated cutting tool with a coating comprising an upper layer and an lower layer each formed of (Cr,Al,Zr)N. The upper layer has an average thickness of 0.5-1.5 µm and the lower has an average thickness of 2-6 µm. The upper layer has a laminated structure of a thin layer A and a thin layer B. Each A and B layer having an average thickness of 5-20 nm. The lower layer has the formula $(Cr_{1-x-y}Al_xZr_y)N$, where $0.55 \le x \le 0.75$ and $0.05 \le y \le 0.15$.
The thin layer A has the formula $(Cr_{1-x-y}Al_xZr_y)N$, where $0.01 \le x \le 0.06$ and $0.35 \le y \le 0.55$.
The thin layer B has the formula $(Cr_{1-x-y}Al_xZr_y)N$, where $0.25 \le x \le 0.40$ and $0.20 \le y \le 0.30$.

WO200605217 discloses a coated cutting tool with a wear resistant coating comprising the following composition $Al_{1-a-b-c-d}Cr_aX_bSi_cB_dZ$, where X is at least one element from Nb, Mo, W or Ta; Z is one element or compound from N, C, CN, NO, CO, CNO; and $0.2 <= a <= 0.5$; $0.01 <= b <= 0.2$; $0 <= c <= 0.1$; $0 <= d <= 0.1$.

JP2007007765 discloses a coated cutting tool with a coating comprising an upper layer and an lower layer each formed of (Cr,Al,Zr)N. The upper layer has an average thickness of 0.5-1.5 µm and the lower has an average thickness of 2-6 µm. The upper layer has a laminated structure of a thin layer A and a thin layer B. Each A and B layer having an average thickness of 5-20 nm. The lower layer has the formula $(Cr_{1-x-y}Al_xZr_y)N$, where $0.50 \le x \le 0.65$ and $0.01 \le y \le 0.10$.
The thin layer A has the formula $(Cr_{1-x-y}Al_xZr_y)N$, where $0.15 \le x \le 0.30$ and $0.35 \le y \le 0.50$.
The thin layer B has the formula $(Cr_{1-x-y}Al_xZr_y)N$, where $0.50 \le x \le 0.65$ and $0.01 \le y \le 0.10$.

Today industry continuously seeks solutions for economic and high productivity/feed-through manufacturing. To meet these demands there is a need for new materials with advanced properties to improve tool life during operation. Within the metal cutting tool industry, a major part of this effort is focused to improve the wear behavior of the cutting tools by designing the properties of the coating material used in the application. Typically, a high productivity/feed-through cutting process results in a dramatic increase of the tool temperature and hence a coating material with a high temperature wear resistance is essential.

OBJECT OF THE INVENTION

It is an object of the present invention to provide a coating material with improved high temperature performance in metal cutting applications.
It is further an object of the present invention to provide a method for coating a cutting tool with said coating.

SUMMARY OF THE INVENTION

According to a first aspect of the invention the object is achieved by a coated cutting tool comprising a body with a hard and wear resistant coating on the body, the coating comprises at least one metal based nitride layer, wherein said layer is $(Zr_xCr_{1-x-y-z}Al_yMe_z)N_a$ with $0.55 < x < 0.85$, $0.05 < y < 0.45$, $0 \le z < 0.20$, $0.95 < a < 1.10$, and Me is one or more of the elements selected from the group consisting of Y, Ti, V, Nb, Ta, Mo, W, Mn or Si, and that the layer comprises a single cubic phase or a single hexagonal phase or a mixture thereof, preferably a cubic phase of a sodium chloride structure, and that the layer has a thickness between 0.5 µm and 15 µm. Thereby a hard and wear resistant coating with high temperature wear resistance is achieved. The enhanced temperature properties of the coating are, for example, observed as an improved crater wear resistance in metal machining by chip removal generating high temperature performance.

According to one embodiment of the invention $0.60 < x < 0.80$, preferably $0.65 < x < 0.75$. According to an alternative embodiment to the above described embodiment $0.55 < x \le 0.70$. According to yet an alternative embodiment of the above described embodiment $0.70 < x < 0.85$.

According to one embodiment of the invention $0.05 < y < 0.35$, preferably $0.05 < y < 0.25$. According to an alternative embodiment to the above described embodiment $0.05 < y \le 0.20$. According to yet an alternative embodiment to the above described embodiment $0.20 < y < 0.45$.

According to one embodiment of the invention $0 \le z < 0.15$, preferably $0 \le z < 0.10$, most preferably $z = 0$. According to an alternative embodiment to the above described embodiment $0.05 \le z < 0.20$, preferably $0.10 \le z < 0.15$.

According to one embodiment of the invention Me is one or more of the elements selected from the group consisting of Ta, Ti, Nb and Si. By the addition of small amounts of one or more of the elements Ta, Ti, Nb and Si, excellent high temperature resistance is achieved.

According to one embodiment of the invention the at least one metal based nitride layer has a thickness between 0.5 µm and 10 µm, preferably between 0.5 µm and 5 µm.

According to one embodiment of the invention the at least one metal based nitride layer has a nanohardness >20 GPa, preferably the nanohardness is between 25 GPa and 40 GPa, most preferably between 30 GPa and 40 GPa.

According to one embodiment of the invention the coating consists of an innermost single layer and/or multilayer comprising, e.g., TiN, TiC, Ti(C,N) or (Ti,Al)N, preferably a single layer of (Ti,Al)N, followed by said (Zr,Cr,Al,Me)N layer and an outer single layer and/or multilayer comprising, e.g., TiN, TiC, Ti(C,N) or (Ti,Al)N, preferably a single layer of TiN, to a total coating thickness between 1 µm and 20 µm, preferably between 1 µm and 15 µm, and most preferably between 1 µm and 7 µm.

According to one embodiment of the invention the coated cutting tool is a cutting tool insert for machining by chip removal, said insert comprises a body of a hard alloy of cemented carbide, cermet, ceramics, cubic boron nitride based material or high speed steel. According to an alternative embodiment the coated cutting tool is a drill or an end mill.

According to a second aspect of the invention the object is achieved by a method for making a coated cutting tool with a hard and wear resistant coating by growing a metal based nitride layer by cathodic arc evaporation with an evaporation current between 50 A and 200 A using composite and/or alloyed cathodes, wherein said layer is $(Zr_xCr_{1-x-y-z}Al_yMe_z)N_a$ with $0.55<x<0.85$, $0.05<y<0.45$, $0\leq z<0.20$ and $0.95<a<1.10$, where Me is one or more of the elements: Y, Ti, V, Nb, Ta, Mo, W, Mn or Si, in a reactive atmosphere containing $N_2$ and optionally with a carrier gas such as, e.g. Ar, at a total gas pressure between 1.0 Pa and 7.0 Pa, preferably between 1.5 Pa and 4.0 Pa, with a negative substrate bias between 0 V and 300 V, preferably between 10 V and 150 V, at a temperature between 200° C. and 800° C., preferably between 300° C. and 600° C.

According to a third aspect of the invention the object is achieved by use of a cutting tool insert for machining by chip removal, specifically generating high temperatures, at cutting speeds of 50-400 m/min, preferably 75-300 m/min, with an average feed, per tooth in the case of milling, of 0.08-0.5 mm, preferably 0.1-0.4 mm, depending on cutting speed and insert geometry.

DETAILED DESCRIPTION OF PREFERRED EMBODIMENTS

Figure 1:
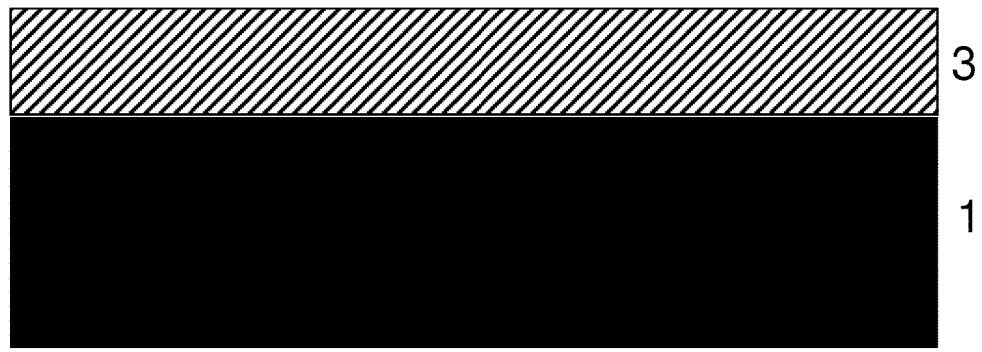
FIG. 1 is a schematic view of a cross-section of part of a cutting tool comprising a body and a (Zr,Cr,Al,Me)N layer.

According to one embodiment of the present invention, there is provided a body 1 onto which a hard and wear resistant coating is deposited comprising at least one metal based nitride layer 3 as shown in FIG. 1. The metal based nitride layer 3 is $(Zr_xCr_{1-x-y-z}Al_yMe_z)N_a$ with $0.55<x<0.85$, $0.05<y<0.45$, $0\leq z<0.20$, $0.95<a<1.10$ and Me is one or more of the elements selected from the group consisting of Y, Ti, V, Nb, Ta, Mo, W, Mn and Si, and the layer comprises a single cubic phase or a single hexagonal phase or a mixture thereof, preferably with a cubic sodium chloride structure, as determined by X-ray diffraction. The metal based nitride layer has a thickness between 0.5 µm and 15 µm, preferably between 0.5 µm and 10 µm, most preferably between 0.5 µm and 5 µm. Additionally, the layer contains a sum of oxygen (O) and carbon (C) concentration between 0 and 2 at %, preferably between 0 and 1 at %.

The elemental composition of said layer, x, y and z including O and C, is estimated from measurements by, e.g., EDS or WDS techniques and is, within the measurement accuracy, essentially constant all through the layer thickness with a variation less than 10%, including the influence of normal process variations such as, e.g., rotation of the inserts during growth.

Said layer has a columnar microstructure with an average column width of <1 µm, preferably <0.6 µm, as determined by cross sectional transmission electron microscopy of a middle region of the layer, i.e. a region within 30% to 70% of the layer thickness in the growth direction, and said average columnar width is the average of at least 10 adjacent columns.

Said layer has a compressive stress level of $-6.0$ GPa$<\sigma<-0.5$ GPa, preferably of $-3.0$ GPa $<\sigma<-1.0$ GPa. The residual stress is evaluated by XRD using the $\sin^2\psi$-method with a Poisson's ratio of $\nu=0.23$ and a Young's modulus of E $=379$ GPa.

Said layer has a nanohardness >20 GPa, as measured by nanoindentation measurements. Nanohardness data were estimated by the nanoindentation technique of the layers after mechanical polishing of the surface using a UMIS 2000 nanoindentation system with a Berkovich diamond tip with a maximum tip load of 25 mN.

According to one embodiment of the invention, z =0, and said layer is $(Zr_xCr_{1-x-y}Al_y)N_a$ with $0.55<x<0.85$, preferably $0.60<x<0.80$, most preferably $0.65<x<0.75$, $0.05<y<0.45$, preferably $0.05<y<0.35$, most preferably $0.05<y<0.25$, $0\leq z<0.20$ and $0.95<a<1.10$.

It is evident that said (Zr,Cr,Al,Me)N layer can be part of a complex coating design and used as an inner, middle and/or an outer layer of said complex coating.

Figure 2:
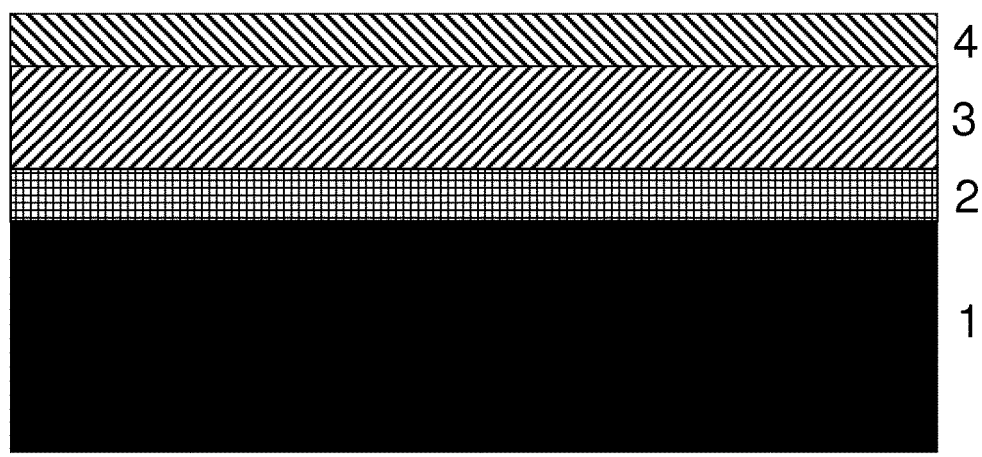
FIG. 2 is a schematic view of a cross-section of part of a cutting tool comprising a body and a coating consisting of an innermost single layer and/or multilayer, a (Zr,Cr,Al,Me)N layer and an outermost single layer and/or multilayer
Figure 3:
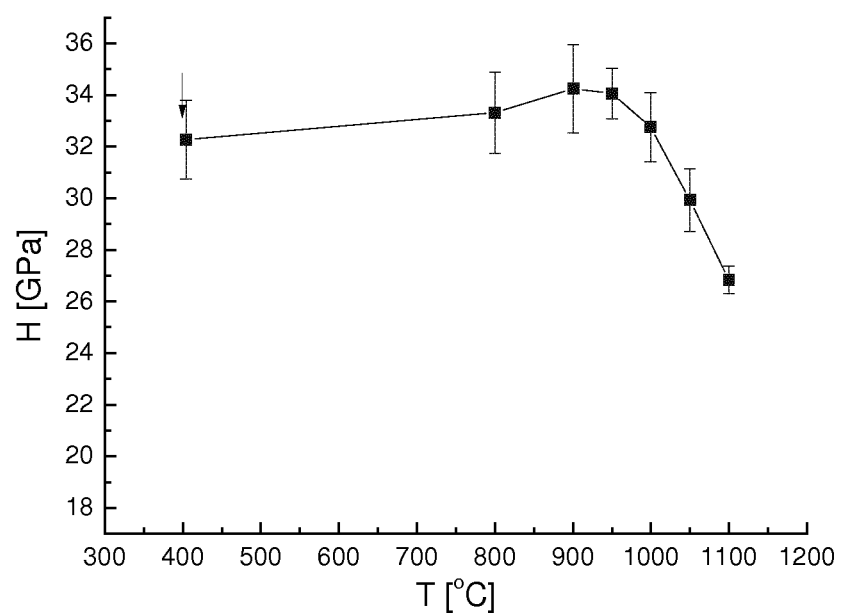
FIG. 3 is a diagram of the nanohardness, H, as a function of post heat treatment, T, of $(Zr_{0.75}Cr_{0.14}Al_{0.11})N_{1.03}$ layer.

FIG. 2 shows an embodiment of the invention, where the cutting tool 1 comprises a body 1, also called substrate, provided with a coating consisting of an innermost single layer and/or multilayer 2 comprising, e.g., TiN, TiC, Ti(C,N) or (Ti,Al)N, preferably a single layer of (Ti,Al)N, followed by said (Zr,Cr,Al,Me)N layer 3 and an outermost single layer and/or multilayer 4 comprising, e.g., TiN, TiC, Ti(C,N) or (Ti,Al)N, preferably a single layer of TiN, with a total coating thickness between 1 µm and 20 µm, preferably between 1 µm and 15 µm, and most preferably between 1 µm and 7 µm.

According to one embodiment of the invention, said body is a cutting insert for machining by chip removal comprising a body of a hard alloy of cemented carbide, cermet, ceramics, cubic boron nitride based material or high speed steel. It is, however, obvious that said body can be other metal cutting tools, e.g., drills and end mills.

The deposition method for said layer is based on PVD techniques, e.g., cathodic arc evaporation or magnetron sputtering using one or more pure, composite and/or alloyed (Zr,Cr,Al, Me) cathodes/targets.

In the case of cathodic arc evaporation, the metal based nitride layer is grown with an evaporation current between 50 A and 200 A depending on the cathode size, and said layer is $(Zr_xCr_{1-x-y-z}Al_yMe_z)N_a$ with $0.55<x<0.85$, $0.05<y<0.45$, $0\leq z<0.20$ and $0.95<a<1.10$. A higher evaporation current is needed for larger cathodes in order to achieve comparable deposition conditions. The layers are grown using one or more composite and/or alloyed cathodes. The desired layer composition is obtained by selecting appropriate composition of the (Zr,Cr,Al,Me) cathode and gas atmosphere, where Me, when present in the layer, is one or more of the elements selected from the group consisting of Y, Ti, V, Nb, Ta, Mo, W, Mn and Si in a reactive atmosphere containing $N_2$ and optionally with a carrier gas such as, e.g., Ar at a total gas pressure between 1.0 Pa and 7.0 Pa, preferably between 1.5 Pa and 4.0 Pa. The negative substrate bias is between 0 V and 300 V, preferably between 10 V and 150 V, most preferably between 15 V and 60 V. The deposition temperature is between 200° C. and 800° C., preferably between 300° C. and 600° C.

In the case of magnetron sputtering, (Zr,Cr,Al,Me)N layers may be grown with a power density applied to the sputter target between 0.5 W/cm² and 15 W/cm², preferably between 1 W/cm² and 5 W/cm², from co-sputtering of pure elemental targets by altering the power to the respective targets (alter the deposition rate for each target) or from a composite and/or alloyed target, where Me, when present, is one or more of the elements selected from the group consisting of Y, Ti, V, Nb, Ta, Mo, W, Mn and Si in a reactive atmosphere containing $N_2$ and optionally with a carrier gas such as, e.g., Ar at a total pressure between 0.1 Pa and 5.0 Pa, preferably between 0.1 Pa and 2.5 Pa. The desired layer composition is obtained by selecting appropriate composition of the (Zr,Cr,Al,Me) target, target power density and gas atmosphere. The negative substrate bias is between 0 V and 300 V, preferably between 10 V and 150 V, most preferably between 10 V and 80 V. The deposition temperature is between 200° C. and 800° C., preferably between 300° C. and 600° C.

The invention also relates to the use of coated cutting tool insert according to the above for machining at cutting speeds of 50-400 m/min, preferably 75-300 m/min, with an average feed, per tooth in the case of milling, of 0.08-0.5 mm, preferably 0.1-0.4 mm, depending on cutting speed and insert geometry.

EXAMPLE 1

Cemented carbide inserts with composition 94 wt % WC-6 wt % Co were used as a body for the layer depositions by cathodic arc evaporation.

Before deposition, the inserts were cleaned in ultrasonic baths of an alkali solution and alcohol. The system was evacuated to a pressure of less than $2.0\times10^{-3}$ Pa, after which the inserts were sputter cleaned with Ar ions. $(Zr_xCr_{1-x-y-z}Al_yMe_z)N_a$ layers, $0.43<x<0.85$, $0.05<y<0.45$, $z=0$ and $1.00\leq a<1.09$, coatings 1-18 in Table 1, were grown using (Zr,Cr,Al) cathodes, with compositions according to coatings 1-18 in Table 2. The layers were deposited at 450° C. in a pure $N_2$ atmosphere, a process pressure of 3 Pa, a bias of −30 V and an evaporation current of 60 A to a total thickness of about 3 μm.

TABLE 1

| | | Coating composition (at %) | | | | |
|---|---|---|---|---|---|---|
| Coating | Description | Zr | Cr | Al | Me | N |
| 1 | ZrCrAlN | 0.43 | 0.31 | 0.25 | | 1.02 |
| 2 | ZrCrAlN | 0.50 | 0.22 | 0.28 | | 1.04 |
| 3 | ZrCrAlN | 0.55 | 0.40 | 0.05 | | 0.97 |
| 4 | ZrCrAlN | 0.53 | 0.33 | 0.14 | | 1.04 |
| 5 | ZrCrAlN | 0.54 | 0.23 | 0.23 | | 1.02 |
| 6 | ZrCrAlN | 0.55 | 0.11 | 0.34 | | 1.02 |
| 7 | ZrCrAlN | 0.56 | 0.00 | 0.45 | | 1.02 |
| 8 | ZrCrAlN | 0.64 | 0.31 | 0.05 | | 1.06 |
| 9 | ZrCrAlN | 0.64 | 0.21 | 0.15 | | 1.08 |
| 10 | ZrCrAlN | 0.65 | 0.09 | 0.26 | | 1.09 |
| 11 | ZrCrAlN | 0.63 | 0.03 | 0.34 | | 1.00 |
| 12 | ZrCrAlN | 0.72 | 0.24 | 0.04 | | 1.01 |
| 13 | ZrCrAlN | 0.75 | 0.14 | 0.11 | | 1.03 |
| 14 | ZrCrAlN | 0.74 | 0.13 | 0.13 | | 1.04 |
| 15 | ZrCrAlN | 0.76 | 0.00 | 0.24 | | 1.06 |
| 16 | ZrCrAlN | 0.81 | 0.08 | 0.11 | | 1.03 |
| 17 | ZrCrAlN | 0.85 | 0.09 | 0.06 | | 1.01 |
| 18 | ZrCrAlN | 0.85 | 0.00 | 0.14 | | 1.03 |
| 19 | ZrCrAlTiN | 0.57 | 0.19 | 0.16 | 0.08 | 1.04 |
| 20 | ZrCrAlNbN | 0.58 | 0.22 | 0.15 | 0.05 | 1.02 |
| 21 | ZrCrAlNbN | 0.60 | 0.10 | 0.16 | 0.14 | 1.02 |
| 22 | ZiCrAlTaN | 0.62 | 0.12 | 0.17 | 0.09 | 1.02 |
| 23 | ZrCrAlSiN | 0.56 | 0.15 | 0.23 | 0.06 | 1.06 |
| 24 | ZrCrAlSiN | 0.55 | 0.12 | 0.25 | 0.08 | 1.00 |

TABLE 2

| | | Cathode composition (at %) | | | |
|---|---|---|---|---|---|
| Coating | Description | Zr | Cr | Al | Me |
| 1 | ZrCrAlN | 0.40 | 0.35 | 0.25 | |
| 2 | ZrCrAlN | 0.50 | 0.20 | 0.30 | |
| 3 | ZrCrAlN | 0.55 | 0.35 | 0.10 | |
| 4 | ZrCrAlN | 0.55 | 0.30 | 0.15 | |
| 5 | ZrCrAlN | 0.60 | 0.20 | 0.20 | |
| 6 | ZrCrAlN | 0.60 | 0.05 | 0.35 | |
| 7 | ZrCrAlN | 0.60 | | 0.40 | |
| 8 | ZrCrAlN | 0.65 | 0.25 | 0.10 | |
| 9 | ZrCrAlN | 0.65 | 0.20 | 0.15 | |
| 10 | ZrCrAlN | 0.65 | 0.10 | 0.25 | |
| 11 | ZrCrAlN | 0.65 | | 0.35 | |
| 12 | ZrCrAlN | 0.75 | 0.20 | 0.05 | |
| 13 | ZrCrAlN | 0.75 | 0.15 | 0.10 | |
| 14 | ZrCrAlN | 0.75 | 0.10 | 0.15 | |
| 15 | ZrCrAlN | 0.75 | | 0.25 | |
| 16 | ZrCrAlN | 0.80 | 0.10 | 0.10 | |
| 17 | ZrCrAlN | 0.85 | 0.05 | 0.10 | |
| 18 | ZrCrAlN | 0.85 | | 0.15 | |
| 19 | ZrCrAlTiN | 0.60 | 0.15 | 0.15 | 0.10 |
| 20 | ZrCrAlNbN | 0.60 | 0.20 | 0.15 | 0.05 |
| 21 | ZrCrAlNbN | 0.60 | 0.10 | 0.15 | 0.15 |
| 22 | ZiCrAlTaN | 0.65 | 0.10 | 0.15 | 0.10 |
| 23 | ZrCrAlSiN | 0.55 | 0.15 | 0.25 | 0.05 |
| 24 | ZrCrAlSiN | 0.55 | 0.10 | 0.25 | 0.10 |

EXAMPLE 2

Example 1 was repeated using (Zr,Cr,Al,Me) cathodes for the deposition of the $(Zr_xCr_{1-x-y-z}Al_yMe_z)N_a$ layers, coatings 19-24 in Table 1 using cathodes as specified for coatings 19-24 in Table 2.

EXAMPLE 3

The composition x, y, z and a, of the $(Zr_xCr_{1-x-y-z}Al_yMe_z)N_a$ layers was estimated by energy dispersive spectroscopy (EDS) analysis using a LEO Ultra 55 scanning electron microscope operated at 10 kV and equipped with a Thermo Noran EDS detector. The data were evaluated using the Noran System Six (NSS ver 2) software.

The phase structure of as-deposited $(Zr_xCr_{1-x-y-z}Al_yMe_z)N_a$ layers where characterized by X-ray diffraction (XRD) using Cu K alpha radiation and a θ-2θ configuration in a Bruker AXS D8 Advance diffractometer.

The residual stresses, σ, of the $(Zr_{1-x-z}Si_xMe_z)N_y$ layers were evaluated by XRD measurements using the $\sin^2 \psi$ method (see e.g. I.C. Noyan, J.B. Cohen, Residual Stress Measurement by Diffraction and Interpretation, Springer-Verlag, New York, 1987). The measurements were performed using CuKα-radiation on the (311)-reflection. The residual stress values were within $-5.0$ GPa$<\sigma<-1.0$ GPa for the different layers as evaluated using a Poisson's ratio of ν=0.23 and Young's modulus of E =379 GPa.

Hardness data were estimated by the nanoindentation technique of the layers after mechanical polishing of the surface using a UMIS 2000 nanoindentation system with a Berkovich diamond tip with a maximum tip load of 25 mN. FIG. 2 shows the nanohardness, H, of $(Zr_{0.75}Cr_{0.14}Al_{0.11})N_{1.03}$ layer as a function of post heat treatment, demonstrating its typical age hardening behavior.

EXAMPLE 4

For a cutting test using the coatings from Table 1 (example 1) in a turning operation with the following data:

Geometry: CNMG120408-MF1

Application: Facing

Work piece material: 100Cr6

Cutting speed: 200 m/min

Feed: 0.25 mm/rev.

Depth of cut: 2 mm

Performance criterion: Crater wear resistance the following relative cutting results, as shown in Table 3, are expected. Coatings 12-15 of the invention are expected with improved crater wear performance with a stop criteria of 1 mm² crater area, and compared to the reference materials according to prior art.

TABLE 3

| Coating | Relative performance |
|---|---|
| Coatings according to embodiments of the invention | |
| coating 1 | 80-90 |
| coating 2 | 80-90 |
| coating 3 | 80-90 |
| coating 4 | 80-90 |
| coating 5 | 80-90 |
| coating 6 | 80-90 |
| coating 7 | 90-100 |
| coating 8 | 90-100 |
| coating 9 | 90-100 |
| coating 10 | 90-100 |
| coating 11 | 90-100 |
| coating 12 | 100-110 |
| coating 13 | 110-120 |
| coating 14 | 110-120 |
| coating 15 | 100-110 |
| coating 16 | 90-100 |
| coating 17 | 90-100 |
| coating 18 | 90-100 |
| coating 19 | 70-80 |
| coating 20 | 90-100 |
| coating 21 | 90-100 |
| coating 22 | 70-80 |
| coating 23 | 80-90 |
| coating 24 | 80-90 |

TABLE 3-continued

| Coating | Relative performance |
|---|---|
| Reference coatings according prior art | |
| $Ti_{0.34}Al_{0.66}N$ (ref) | 70-80 |
| $Al_{0.68}Cr_{0.32}N$ (ref) | 60-70 |
| TiN (ref) | 50-60 |

The invention claimed is:

1. A coated cutting tool comprising:
   a body; and
   a hard and wear resistant coating on the body, the coating comprising at least one metal based nitride layer, wherein said layer is $(Zr_xCr_{1-x-y}Al_y)N_a$ with $0.60<x<0.80$, $0.05<y<0.20$, $0.95<a<1.10$, and that the layer has a single cubic phase or a single hexagonal phase or a mixture thereof or a cubic phase of a sodium chloride structure, and that the layer has a thickness between 0.5 μm and 15 μm.

2. The coated cutting tool according to claim 1, wherein $0.65<x<0.75$.

3. The coated cutting tool according to claim 1, wherein said at least one metal based nitride layer has a thickness between 0.5 μm and 10 μm.

4. The coated cutting tool according to claim 1, wherein said at least one metal based nitride layer has a nanohardness >20 GPa.

5. The coated cutting tool according to claim 4, wherein said at least one metal based nitride layer has a nanohardness between 25 GPa and 40 GPa.

6. The coated cutting tool according to claim 1, wherein said coating includes an innermost single layer of TiN, and the coating has a total coating thickness between 1 μm and 20 μm.

7. The coated cutting tool according to claim 1, wherein said coated cutting tool is a cutting insert for machining by chip removal, the body being selected from a group of hard alloy of cemented carbide, cermet, ceramics, cubic boron nitride and high speed steel.

8. The coated cutting tool according to claim 1, wherein said coated cutting tool is a drill or end-mill for machining by chip removal, the body being selected from a group of hard alloy of cemented carbide, cermet, ceramics, cubic boron nitride and high speed steel.

9. The coated cutting tool according to claim 1, wherein said coating includes a multilayer comprising, TiN, TiC, Ti(C,N) or (Ti,Al)N, and the coating has a total coating thickness between 1 μm and 20 μm.

10. The coated cutting tool according to claim 1, wherein said coating includes a multilayer comprising preferably a single layer of (Ti,Al)N, followed by the (Zr,Cr,Al)N layer and an outer single layer of TiN, the coating has a total coating thickness between 1 μm and 20 μm.

11. A method of making a coated cutting tool, comprising the steps of:
   growing a metal based nitride layer on a body by cathodic arc evaporation with an evaporation current between 50 A and 200 A using composite and/or alloyed cathodes, wherein said layer is $(Zr_xCr_{1-x-y}Al_y)Na$ with $0.60<x<0.80$, $0.05<y0.20$, $0.95<a<1.10$, in a reactive atmosphere containing $N_2$ and optionally with a carrier gas such as, e.g., Ar at a total gas pressure between 1.0 Pa and 7.0 Pa, with a negative substrate bias between 0 V and 300 V, and at a temperature between 200° C. and 800° C.

* * * * *